United States Patent
Gonsalves et al.

[11] Patent Number: 5,957,465
[45] Date of Patent: Sep. 28, 1999

[54] MODULAR EMC PCI CARD GASKET

[75] Inventors: Daniel Derrick Gonsalves, Hudson, N.H.; Kenneth Kitlas, San Jose, Calif.; Robert Antonnucio, Burlington, Mass.; William Izzicupo, Windham, N.H.; James Carney, Peperell, Mass.; Mark Pugliese, Shrewsbury, Mass.; Joseph Spano, North Reading, Mass.; Mathew Palazola, Gloucester, Mass.; David Desilets, Hopkinton, Mass.

[73] Assignee: Sun Microsystems, Inc., Mountain View, Calif.

[21] Appl. No.: 08/877,152

[22] Filed: Jun. 17, 1997

[51] Int. Cl.⁶ .............................. F16J 15/02; H05K 7/18
[52] U.S. Cl. ................. 277/637; 174/17 CT; 174/35 GC
[58] Field of Search .......................... 174/17 CT, 35 GC; 277/630, 637, 649, 650, 653, 654, 920; 403/230, 253, 386, 388; 206/722, 724, 453, 454, 709, 719; 220/34 G, 350, 528; 29/453

[56] References Cited

U.S. PATENT DOCUMENTS

| | | | |
|---|---|---|---|
| 3,969,572 | 7/1976 | Rostek | 174/35 GC |
| 4,780,570 | 10/1988 | Chuck | 174/35 GC |
| 5,313,016 | 5/1994 | Brusati | 174/35 GC |
| 5,679,923 | 10/1997 | Le | 174/35 GC |

FOREIGN PATENT DOCUMENTS

| | | | |
|---|---|---|---|
| 2257839 | 1/1993 | United Kingdom | 174/35 GC |

*Primary Examiner*—Eric K. Nicholson
*Assistant Examiner*—Gary Grafel
*Attorney, Agent, or Firm*—Julian Caplan; Flehr Hohbach Test Albritton & Herbert LLP

[57] ABSTRACT

A PCI card is inserted through an I/O opening in a computer panel. On one edge of the card is a cover from one end of which projects a tab. A resilient gasket is attached to the panel to create a flexible EMC seal around the opening. Preferably the gasket is formed of tin-plated beryllium copper. The gasket has alternate staggered spring fingers oriented opposite to the direction of insertion of the PCI card. To retain the gasket the panel is formed with slots at either end and an outward struck projection at the middle. The gasket is formed with a tongue at either end to be inserted in one of the slots and a punched-out opening to receive the projection.

13 Claims, 4 Drawing Sheets

MODULAR EMC PCI CARD GASKET

BACKGROUND OF THE INVENTION

1. Field of the Invention

This invention relates to a new and improved gasket which is attached to a panel of a computer casing adjacent an opening into which a peripheral component interconnect card (herein "PCI card") is inserted to provide, among other benefits, an electromagnetic compatibility interface (herein "EMI") seal.

2. Description of Related Art

The use of PCI cards and their insertion through I/O (input-output) openings in computer panels is well understood in the art. One edge of the PCI card is provided with a cover which closes the opening. Very frequently there are adjacent, parallel openings for insertion of such cards. The present invention differs from prior constructions in that there is a gasket attached to either side of the opening in the panel which shields against EMI. Additionally, where there are two adjacent parallel openings a single gasket adjoins the lower edge of one opening and the upper edge of the other opening.

SUMMARY OF THE INVENTION

The gasket of the present invention is formed of a piece of tin-plated beryllium copper or other suitable material. Struck outward along each longitudinal edge of the strip are alternating curved fingers which extend in a direction opposite that in which the PCI card is inserted. In order to hold the gasket in place, slots are formed in the panel adjacent opposite ends of the gasket when assembled. Further a central outward projection is struck in the panel. The gasket is formed with complementary end tabs which snap into the slots and a central opening of irregular shape into which the projection of the panel snaps.

Accordingly one of the features of the invention is that it creates a flexible EMI seal around a PCI card panel opening in the rear or other I/O metal assembly.

Another feature of the invention is that it provides a modular design such that it can be used in multiple parts or multiple assemblies in multiple configurations.

A still further feature of the invention is that the gasket may be installed without the use of hardware and the installation is accomplished rapidly without the need for special skills or tools.

The staggered alternate direction of the spring fingers results in the open ends being oriented downward to the direction of insertion of the PCI card. This eliminates snagging or otherwise damaging the gasket during installation of the card.

BRIEF DESCRIPTION OF THE DRAWINGS

The accompanying drawings, which are incorporated in and form a part of this specification, illustrate embodiments of the invention and, together with the description serve to explain the principles of the invention.

DESCRIPTION OF THE PREFERRED EMBODIMENT

Figure 1:
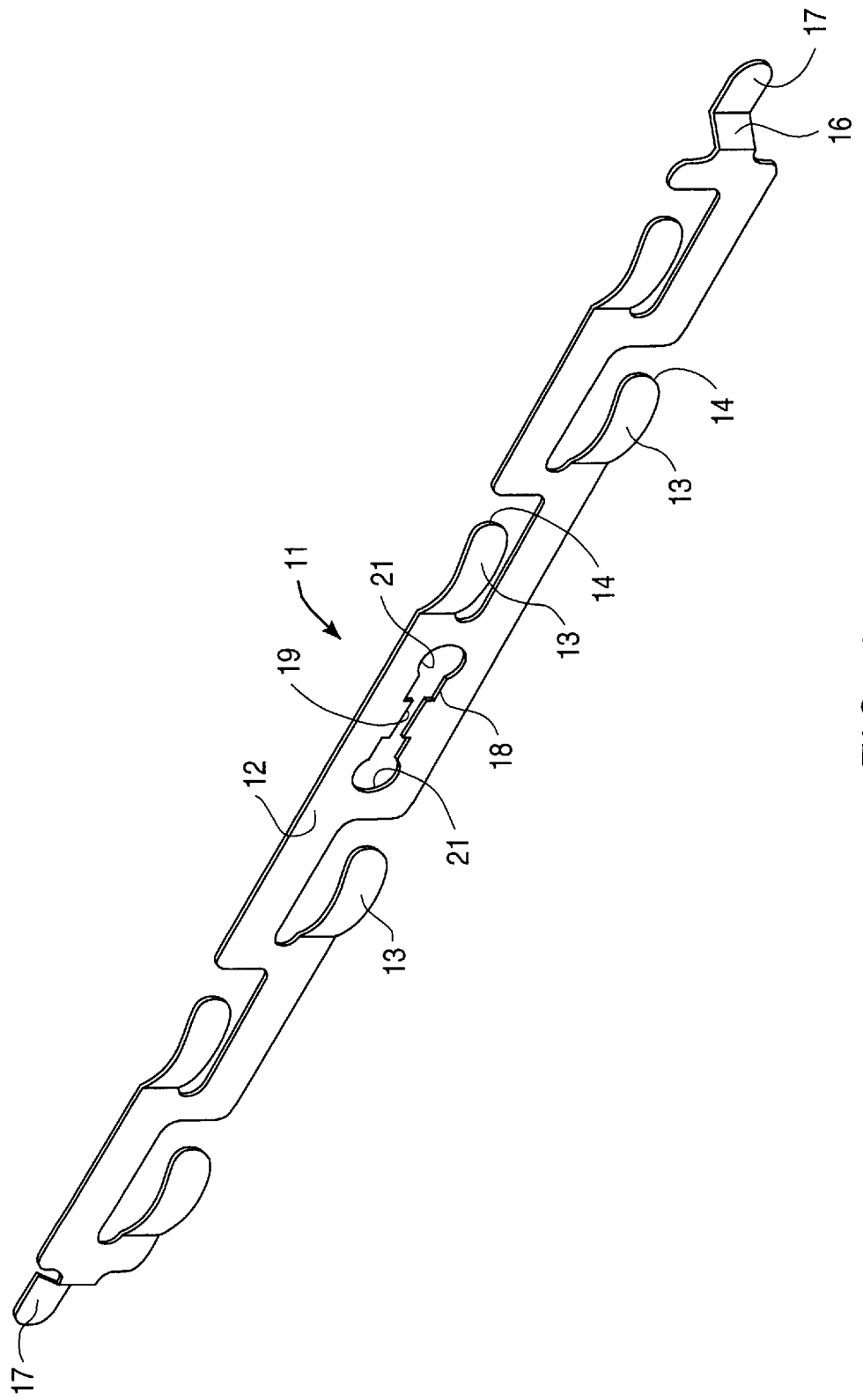
FIG. 1 is a perspective view of a gasket in accordance with the present invention.

The accompanying drawings, which are incorporated in and form a part of this specification, illustrate embodiments of the invention and, together with the description serve to explain the principles of the invention:

Gasket 11 is preferably formed of tin-plated beryllium copper or other suitable material which has spring-like properties and further provides a satisfactory EMC seal. As best shown in FIG. 1 gasket 11 consists of an elongated strip 12 from which are struck curved fingers 13. It will be noted that the fingers alternate (i.e. one on the bottom edge and then the next on the top edge) but are all curved in the same direction so that their rounded ends 14 do not snag when the PCI card is inserted (as hereinafter explained). At either end of strip 12 is an inward bend 16 and the inner edge of bend 16 is formed with perpendicularly outwardly extending tabs 17 which are disposed inwardly relative to the plane of strip 12. At the center of strip 12 is a cut-out 18 formed with a narrow central longitudinally extending center portion 19 and keyhole formed ends at either end of center portion 19.

Figure 2:
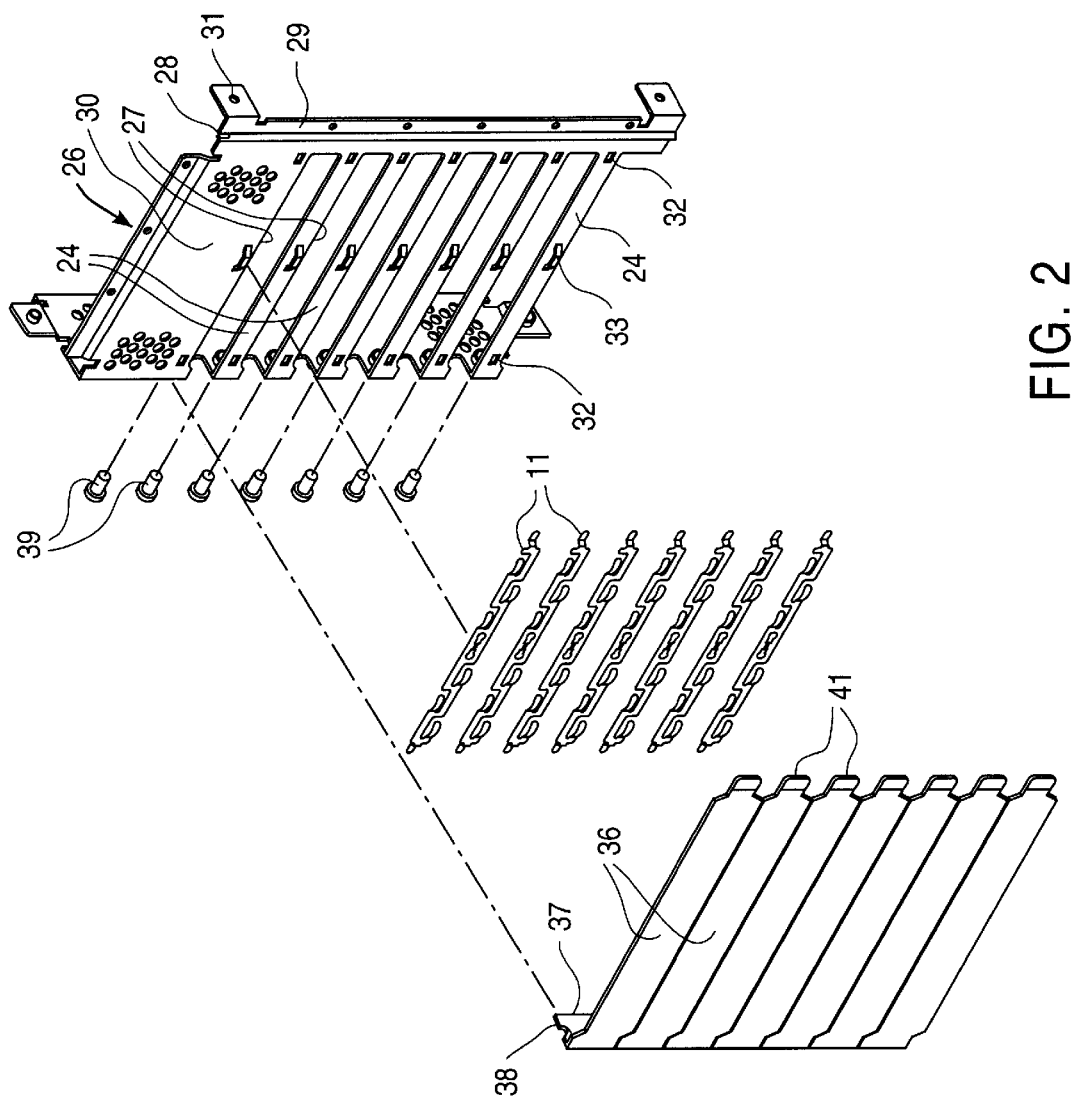
FIG. 2 is an exploded perspective view.
Figure 3:
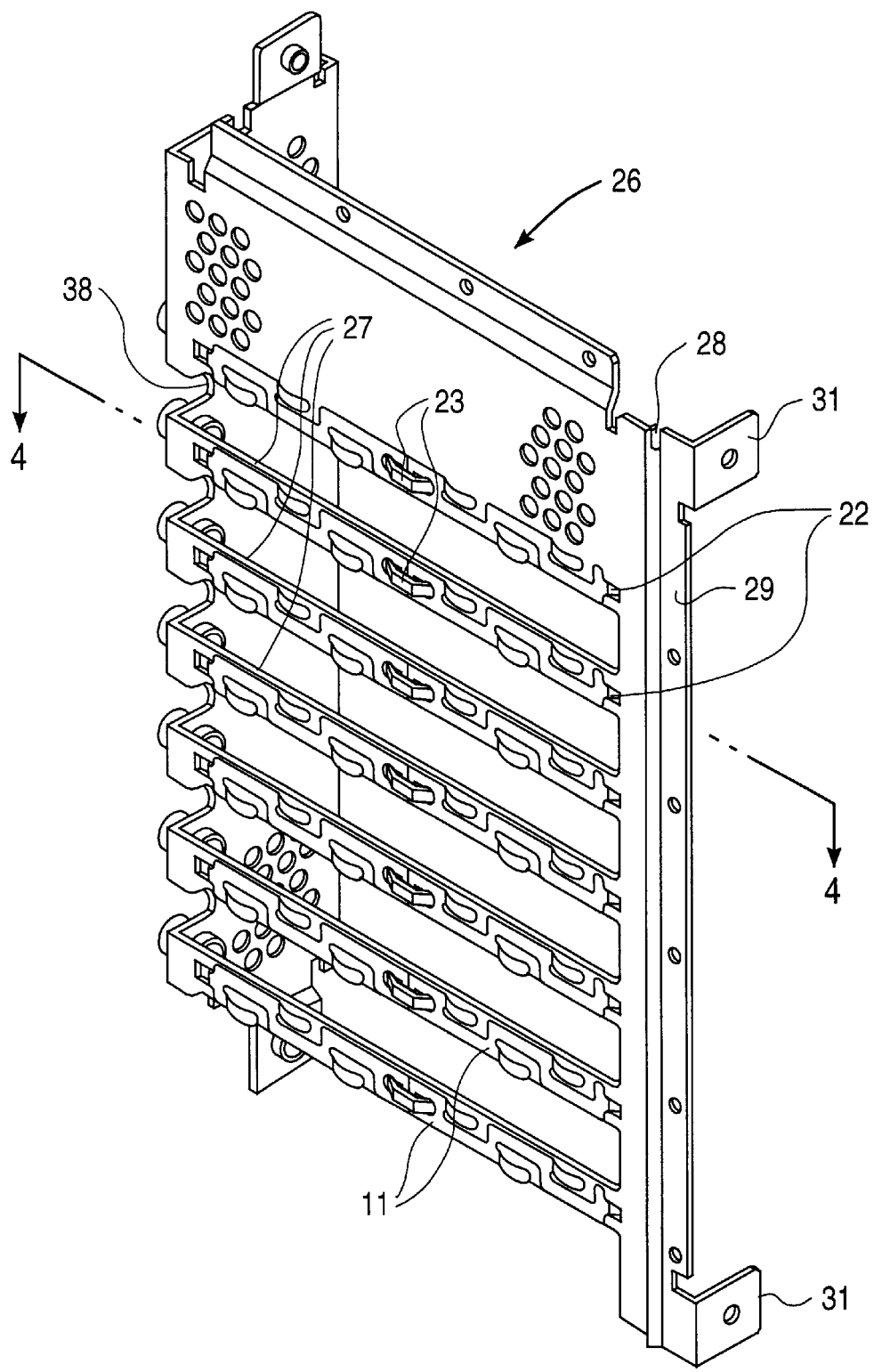
FIG. 3 is an enlarged perspective view showing the panel and gaskets assembled.
Figure 4:
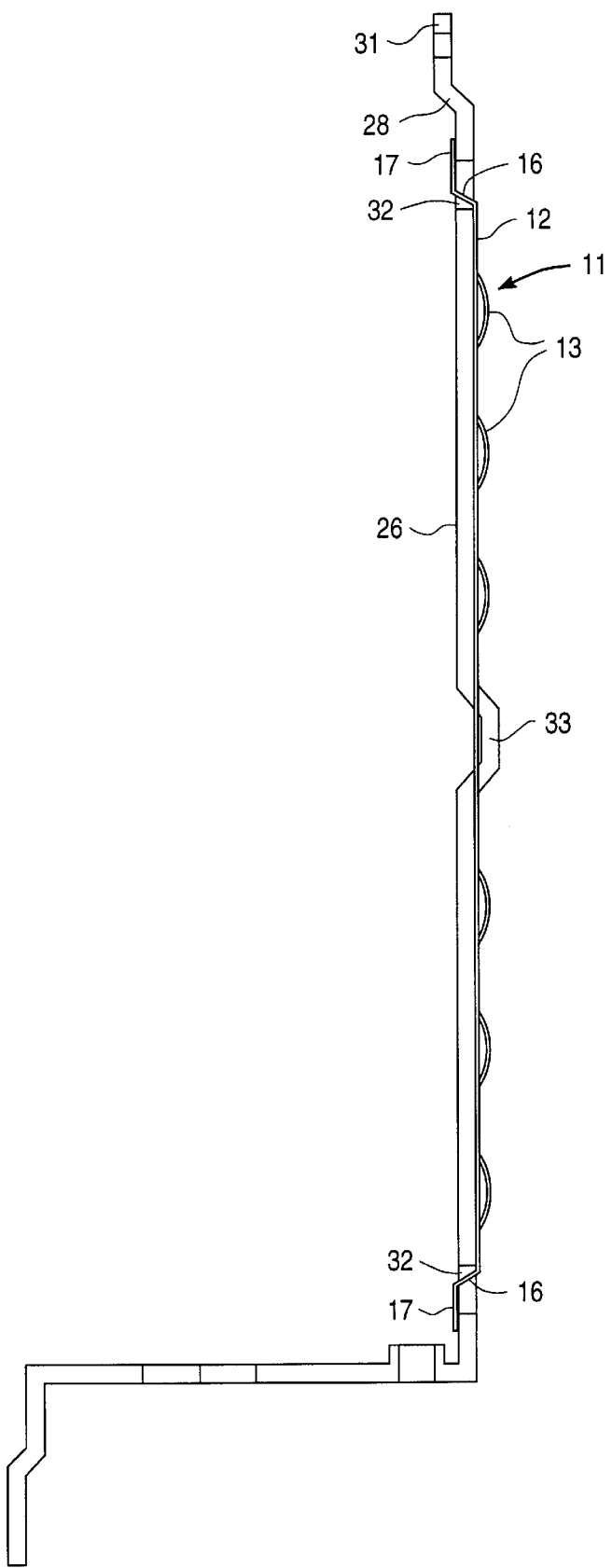
FIG. 4 is an enlarged fragmentary sectional view taken substantially along the line 4—4 of FIG. 3.

One of a number of panels 26 with which the invention may be used is shown in FIGS. 2 and 3. The shape and configuration of panel 26 is subject to considerable variation. As shown, there is a plurality of parallel horizontal openings 27 shaped to receive covers or plates 36 attached to one longitudinal edge of a PCI card (not shown but well understood in the art). The closed areas 24 between openings 27 are of a width substantially equal to the width of gasket 11 and the openings 27 are slightly smaller than the widths of the covers 36. In the particular panel 26 shown, but subject to wide variation, at either longitudinal edge is an inward bend 28 from which extends an outward longitudinally bent edge 29. A tab 31 perpendicular to edge 29 may be used to secure panel 26 in place. In closed areas 24 adjacent either end of openings 27 are slots 32 and similar slots are formed in the top 30 of the panel above the uppermost opening 27. Outward struck protrusions 33 are punched in closed portions 24 and top 30 approximately midway between slots 32.

Accordingly when a gasket 11 is applied on either longitudinal edge of openings 27, the tabs 17 are inserted in the slots 32 and the strip 12 is pushed backwards so that the protrusion 33 snaps into opening 18, thereby retaining the gasket in place.

Covers 22 shown in FIG. 2 but not in FIG. 3 are conventionally secured to one edge of a PCI card (not shown). At one end of cover 36 is a perpendicular tab 37 and in the upper end of tab 37 is formed a notch 38. At the opposite end of cover 36 is a tab 41 which fits into one end of opening 27. Tab 37 is secured to the panel 36 by means of screws 39 which fit through the notches 38 and are threaded into the panel 26 by means well known in the art.

The feature of the present invention is that as the PCI cards are inserted through the openings 27, the spring fingers eliminate snagging or otherwise damaging the gasket during installation.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A gasket of resilient material for use along a longitudinal edge of at least one longitudinal opening in a panel comprising a strip formed with a plurality of fingers alternatingly spaced along longitudinal edges of said strip, each said finger being outwardly curled relative to said strip, all said fingers extending in the same direction, and a cut-out in said strip shaped to snap onto a protrusion in said panel for attaching said strip to said panel.

2. A gasket according to claim 1 which further comprises tabs at either end of said strip shaped and positioned for insertion in slots in said panel.

3. A gasket according to claim 2 in which said tabs are offset rearwardly of said strip.

4. A gasket according to claim 1 formed of tin-plated beryllium copper.

5. A gasket according to claim 1 in which said cut-out is positioned centrally of said strip.

6. A gasket according to claim 5 in which said cut-out comprises a narrow center portion and an enlarged portion at at least one end of said center portion.

7. In combination, a panel formed with a longitudinal first opening shaped to receive a PCI, card first attachment means on said panel, a gasket of resilient material comprising a strip formed with a plurality of fingers alternatingly spaced along longitudinal edges of said strip each said finger being outwardly curled relative to said strip, all said fingers extending in the same direction, and second attachment means on said strip cooperable with said first attachment means to secure said gasket to said strip, said gasket adjoining a longitudinal edge of said first opening, said panel being formed with a second opening adjacent and parallel to said first opening said gasket adjoining a longitudinal edge of said second opening, said panel also being formed with a protrusion adjacent an edge of said first opening and intermediate the ends of said first opening and said strip being formed with a cut-out shaped and positioned to snap onto said protrusion.

8. The combination of claim 7 in which the material of said gasket comprises a seal against EMI.

9. The combination of claim 8 in which the material of said gasket is tin-plated beryllium copper.

10. The combination of claim 7 in which said first attachment means comprises slots formed in said panel adjacent opposite ends of said opening and said second attachment means comprises tabs at opposite ends of said strip shaped to fit into said slots.

11. The combination of claim 10 in which said tabs are offset rearwardly of said strip.

12. The combination of claim 7 in which said cut-out comprises a narrow center portion and an enlarged portion at at least one end of said center portion.

13. In combination, a panel formed with a first longitudinal opening shaped to receive a PCI card, a second longitudinal opening on said panel adjacent and parallel to said first opening, a gasket of resilient material comprising a strip formed with a plurality of fingers alternatingly spaced along longitudinal edges of said strip, each said finger being outwardly curled relative to said strip, all said fingers extending in the same direction, said gasket adjoining a longitudinal edge of said second opening, said panel being formed with a protrusion adjacent an edge of said first opening and intermediate the ends of said first opening and said strip being formed with a cut-out shaped and positioned to snap onto said protrusion, said protrusion being cooperable with said cut-out to secure said gasket to said strip adjoining a longitudinal edge of said opening.

* * * * *